United States Patent [19]

Conway et al.

[11] Patent Number: 4,866,441

[45] Date of Patent: Sep. 12, 1989

[54] WIDE BAND, COMPLEX MICROWAVE WAVEFORM RECEIVER AND ANALYZER, USING DISTRIBUTED SAMPLING TECHNIQUES

[75] Inventors: Larry J. Conway, Stittsville; Paul I. Pulsifer, Kanata; William D. Cornish, Nepean, all of Canada

[73] Assignee: Her Majesty the Queen in right of Canada, as represented by the Minister of National Defence, Ottawa, Canada

[21] Appl. No.: 924,782

[22] Filed: Oct. 30, 1986

[30] Foreign Application Priority Data

Dec. 11, 1985 [CA] Canada .................................. 497407

[51] Int. Cl.[4] .............................................. H03M 1/54
[52] U.S. Cl. .................................. 341/122; 341/124; 341/155; 328/151; 364/178
[58] Field of Search ................. 340/347 SH, 347 AD, 340/347 C, 347 CC, 347 M; 328/14, 15, 65, 151; 364/178, 179; 341/122–125, 155, 126

[56] References Cited

U.S. PATENT DOCUMENTS

| 3,484,591 | 12/1969 | Trimble | 324/77 CS X |
| 3,597,761 | 8/1971 | Fraschilla et al. | 340/347 M X |
| 3,820,112 | 6/1974 | Roth | 340/347 SH X |
| 3,872,387 | 3/1975 | Banach | 455/266 X |
| 4,345,241 | 8/1982 | Takeuchi et al. | 340/347 SH X |
| 4,353,057 | 10/1982 | Bernet et al. | 340/347 SH |
| 4,359,690 | 11/1982 | Tucker et al. | 328/151 |
| 4,611,194 | 9/1986 | Konig et al. | 340/347 SH |

Primary Examiner—William M. Shoop, Jr.
Assistant Examiner—Brian K. Young
Attorney, Agent, or Firm—Stevens, Davis, Miller & Mosher

[57] ABSTRACT

A microwave signal receiving apparatus comprises a delay line for distributing a microwave signal, samplers for sampling the signal spatially along the delay line and producing analog samples, analog-to-digital converters for converting the analog samples to digital samples, and digital memories associated with each converter for storing the digital samples.

25 Claims, 3 Drawing Sheets

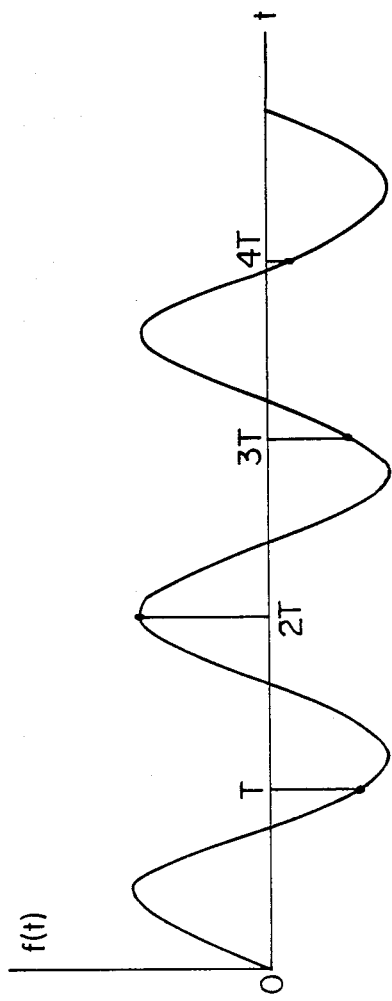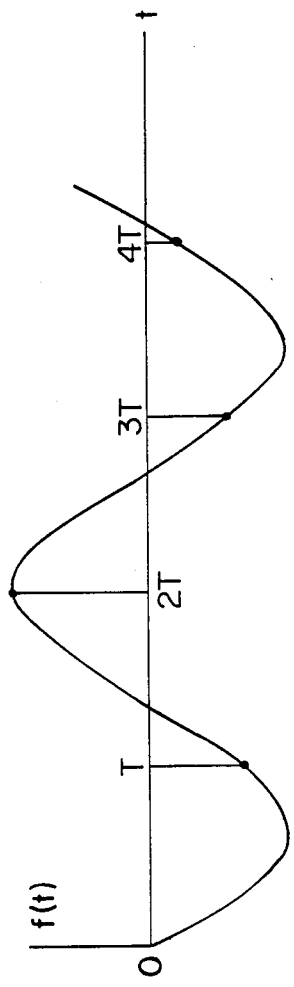
FIG. 3a UNDERSAMPLED WAVEFORM
FIG. 3b RECONSTRUCTED WAVEFORM

4,866,441

WIDE BAND, COMPLEX MICROWAVE WAVEFORM RECEIVER AND ANALYZER, USING DISTRIBUTED SAMPLING TECHNIQUES

The present invention relates to a method and an apparatus for acquiring, storing and analyzing single or multiple simultaneous wideband complex radio frequency (RF) signals.

BACKGROUND OF THE INVENTION

A present method of acquiring, storing and analyzing RF signals is to down-convert an RF signal to an intermediate frequency (IF) by local oscillator mixing for sampling and digitization using existing technology. The digital words generated by the analog to digital conversion process are stored in a digital memory. Once stored the contents may by accessed by a processor unit and analyzed. The drawback of this method is a limitation on the maximum instantaneous bandwidth. Since the process involves down conversation and serial digitization, the maximum instantaneous bandwidth is set by the speed of the current digitization, analog-to-digital (A/D) conversion and digital memory processes. This limits the instantaneous bandwidth to several hundred MHz.

Another method of acquiring, storing and analyzing RF signals employs the strobe principle as employed in sampling oscilloscopes. In sampling oscilloscopes, a voltage sample is taken at a discrete point on an input signal. Subsequent waveforms are sampled at later discrete points in order to obtain the overall waveforms. A drawback of this method is that, although it is capable of handling extremely wide instantaneous bandwidths, the technique is restricted to repetitive signals. It cannot handle transient signals or complex waveforms which vary continuously.

SUMMARY OF THE INVENTION

The present invention employs a distributed sampling technique to acquire RF signals over wide RF bands to allow complex signal analysis, including analysis either at near real-time or at some time after acquisition, to be performed on the acquired signals.

In accordance with one aspect of the present invention, there is provided a method of acquiring a signal to be analyzed, comprising distributing the signal along a delay line, simultaneously sampling the delay line at a plurality of discrete points therealong to produce a plurality of analog samples; converting each of the analog samples to a digital sample, and storing each of the digital samples in a predetermined memory location.

In accordance with another aspect of the present invention, there is provided a microwave signal receiving apparatus comprising delay line means for distributing a microwave signal, means for sampling the signal spatially along the delay line means and producing analog samples, means for converting the analog samples to digital samples, means for storing the digital samples, and means for analyzing the digital samples.

BRIEF DESCRIPTION OF THE DRAWINGS

These and other features of the invention will become more apparent from the description which follows in which reference is made to the appended drawings wherein:

FIGS. 3a and 3b respectively illustrate a waveform to be sampled and a reconstructed waveform after undersampling.

DETAILED DESCRIPTION

Figure 1:
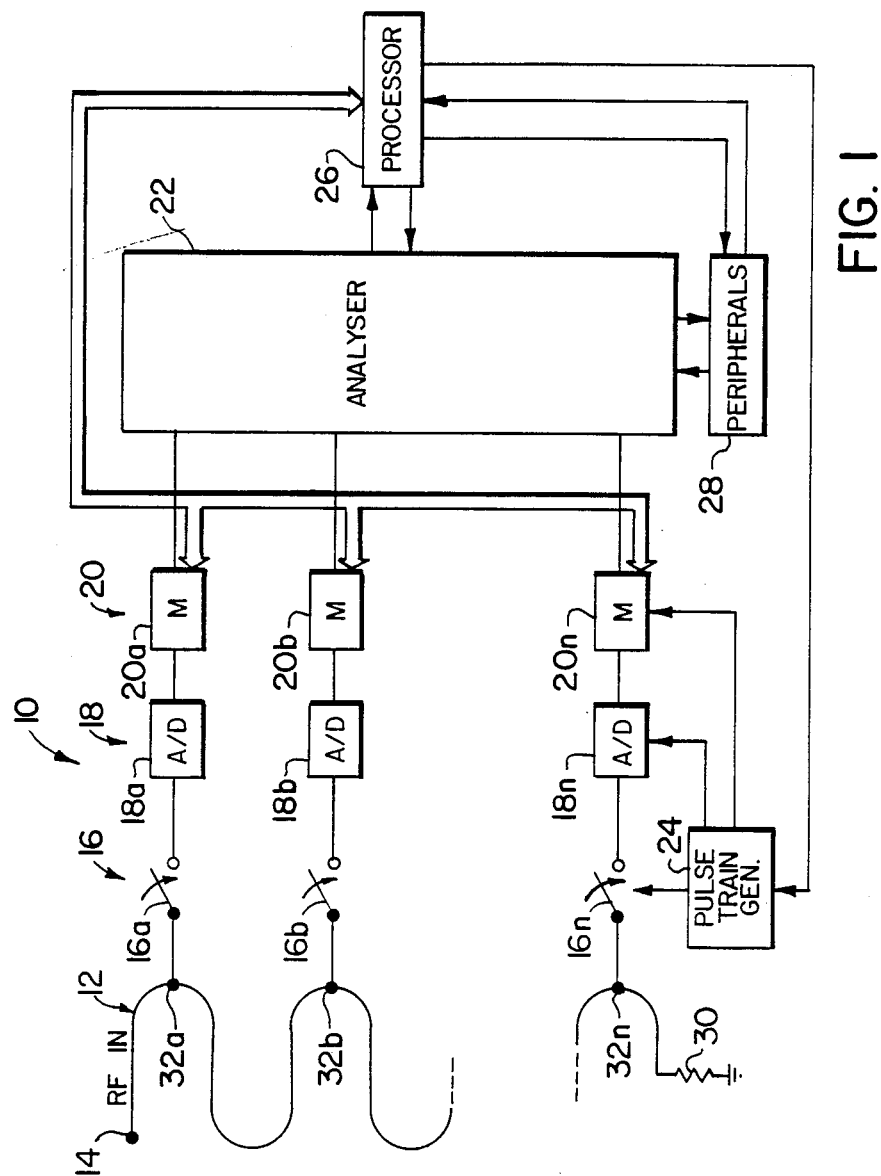
FIG. 1 is a block diagram of the basic components of the present invention.

FIG. 1 illustrates a basic block diagram of the microwave receiving apparatus, generally designated by the reference numeral 10, of the present invention. The apparatus is generally comprised of delay line means 12, having an input terminal 14, for distributing an input microwave signal, means 16 for sampling the signal at discrete points along the delay line means and producing parallel analog samples, means 18 for converting the analog samples to digital samples, means 20 for storing the digital samples and means 22 for analyzing the digital samples. The sampling means, converting means and storing means are responsive to a controller 24 which in turn is controlled by a processor 26 which is adapted to access storing means 20, control analyzer 22 and appropriate peripheral devices 28, such as mass storage devices, printers, video display devices and the like.

The delay line means is of the form of a meander delay line connected to a load or termination resistor 30, as shown, while the sampling means are a plurality of sampling gates 16a to 16n connected at discrete points or taps 32a to 32n respectively along the delay line. The converting means 18 are a plurality of analog-to-digital converters 18a to 18n corresponding in number to the number of sampling gates and each being connected to an associated sampling gate. The storing means 20 includes a plurality of buffers 20a to 20n corresponding in number to the number of analog-to-digital converters and each being connected to a associated analog-to-digital converter. Each buffer has a plurality of storage locations for storing in predetermined sequence the digital outputs of its associated converter. Thus it will be seen that the sampling means, converting means and storing means provide a plurality of parallel signal flow paths between the delay line and the analyzer.

The analyzer 22 may be a hardware dedicated device or a mixed hardware-software device. The construction and operation of the analyzer is well known to those skilled in this art and accordingly it is not described in detail herein. Possible analyzer functions may include FFT algorithms, correlation routines and the like to analyze the input signal in terms of measurements such as frequency, pulse width, pulse repetition rate, signal structure and the like, reconstruct the signal from the digital samples. The signal may then be displayed as desired on an appropriate display device and/or it may be stored indefinitely on a mass storage device for later analysis. The display, storage and other such output devices are generally referred to by reference numeral 28.

The controller may be a pulse train generator connected to the sampling gates, converters and buffers as shown.

Thus, a signal received at input terminal 14 propagates along the meander delay line to termination resistor 24. Upon receipt of an appropriate trigger signal from the processor 26, sampling pulse train generator 24 generates a sampling pulse to allow the voltage distributed along the meander line to be simultaneously sampled by samplers 16a to 16n. The parallel sampled analog voltages are transmitted to and subsequently transformed into digital words of samples by analog-to-digital converters 18a to 18n. The digital words corresponding to the sampled analog voltages are stored in memory locations specified by processor 26 of digital memories 20a to 20n.

Thus, n samples, taken spatially along the input delay line, of the input waveform are stored in the digital memories. If the input signal is longer in time than the delay in the input delay line, the process of sampling, analog-to-digital converting and digital storing is repeated with the digital words corresponding to the subsequent set of n samples being stored in the next available location of each of the memories. The process of sampling, converting and storing is repeated until all of the input waveform has been sampled or until the processor halts the operation.

Once stored the signal is retrieved from memory and passed to analyzer 22 for signal parameter measurements. To do this, the processor sequentially transmits the digital sample in the first memory location of each of memory units 20a to 20n beginning with memory 20n and ending with ending with memory 20a. It then sequentially transmits the digital sample in the second memory location of each of memory units 20a to 20n beginning with memory 20n and ending with ending with memory 20a. This process is repeated until all required samples have been retrieved from memory and delivered to the analyzer. The analyzer then performs the required analysis and outputs the result(s), desired parameter(s) or actual stored signal, on an appropriate peripheral device 28.

Figure 2:
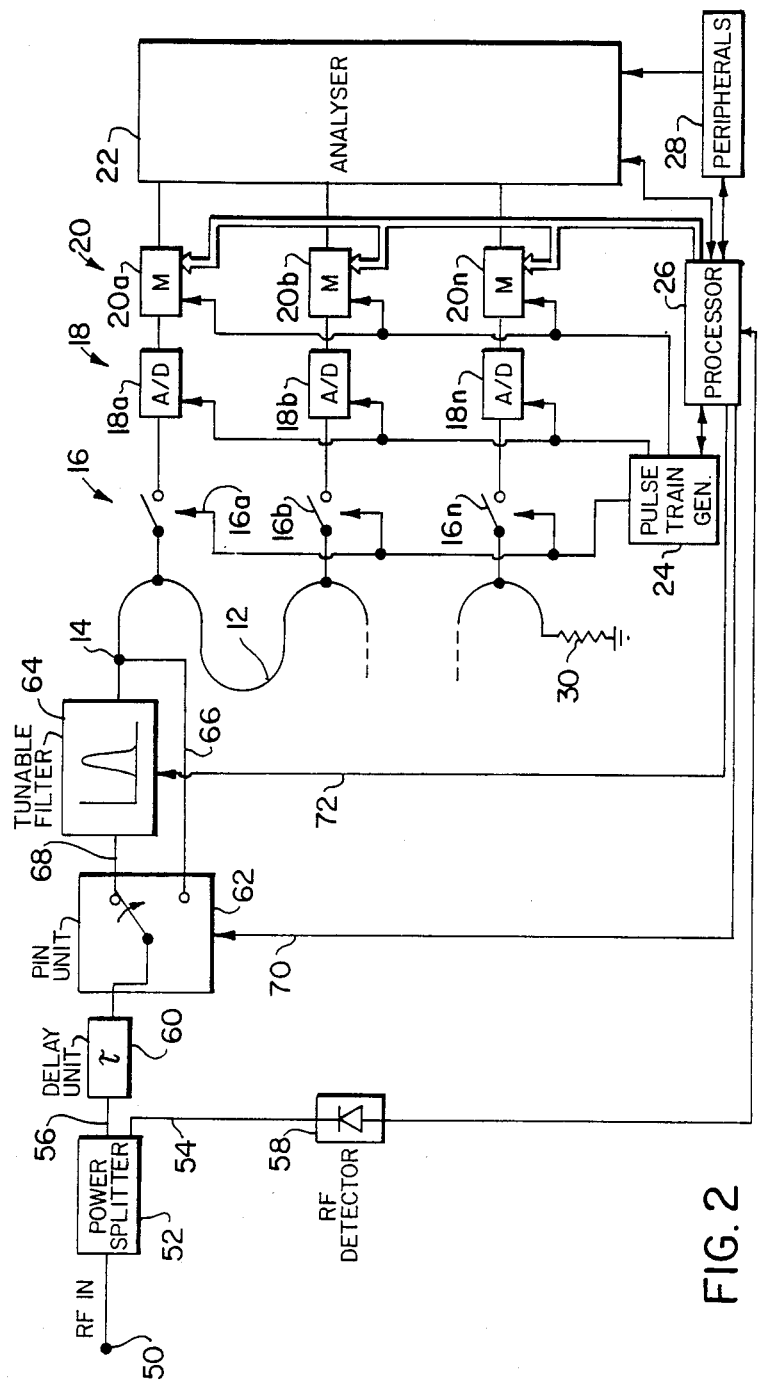
FIG. 2 is a block diagram of a preferred embodiment of the invention.

FIG. 2 illustrates a preferred embodiment which provides time and/or frequency preselection in order to reduce the processing requirements. The embodiment is similar to that of FIG. 1 and; accordingly, like parts have been designated by like reference numerals.

An RF input signal arriving at terminal 50 is divided by a power splitter 52 into two paths 54 and 56. A signal in path 54 is detected by an RF detector 58 which transmits an appropriate signal to processor 26. Path 56 includes a delay unit 60, a PIN switch 62, a tunable filter 64. The output of the filter is connected to circuitry which is substantially as illustrated in FIG. 1 including input terminal 14 of delay line 12. PIN switch 62 is controlled by processor 26 along line 70 and has two output terminals 66 and 68. Terminal 66 is connected to terminal 14 of the delay line and therefore bypasses the filter while terminal 68 is connected to the input of the filter. Filter 64 is controlled by the processor along line 72 to provide bandwidth preselection.

Thus, the processor may control PIN switch 62 and tunable filter 64 to provide frequency preselection and pulse train generator 24 to provide time preselection. Delay circuit 60 is inserted in path 56 to delay the incoming RF signal in order to permit the processor, switch, filter, and pulse generator to respond to the desired time and/or frequency format. However, the delay unit is not essential since the processor may be arranged to set bounds on time and frequency windows after an initial full look at the environment.

Essentially, four basic modes of operation are possible. The first basic mode is a wide open receiver analyzer where there is no time or frequency preselection. In this mode, the incoming RF signal enters terminal 50, passes through delay unit 60 and PIN switch 62 and is routed to terminal 14 via terminal 66. The signal is then distributed, sampled, converted, stored, analyzed and displayed as desired. The pulse train generator is activated from the outset.

The second basic mode entails only frequency preselection. In this mode, the incoming signal enters terminal 50, passes through delay unit 60 and is routed to terminal 14 via terminal 68 and filter 64 by PIN switch 62 under the control of the processor. The pulse train generator is activated from the outset.

The third basic mode of operation allows time preselection only. In this case, the incoming RF signal enters terminal 50, passes through delay unit 60 and is routed to terminal 14 via terminal 66 by PIN switch 62 under the control of the processor. The signal is distributed but is only sampled when the pulse train generator is activated under the control of the processor. Once activated, the signal is sampled, converted, stored, analyzed and displayed as desired.

The fourth and final basic mode of operation provides both time and frequency preselection. In this mode, the incoming RF signal enters terminal 50, passes through delay unit 60 and is routed to terminal 14 via terminal 68 and filter 64 by PIN switch 62 under the control of the processor. The signal is distributed but is only sampled when the pulse train generator is activated by the processor.

Clearly the versatility offered by this approach allows any number of time and/or frequency windows to be implemented in real-time. Equally, it is evident that other types of circuitry are possible (i.e. mixers) to provide either time or frequency preselection and possible configurations are not limited to those discussed above.

Although the description thus far has assumed that the actual signal has been over-sampled, thereby storing the RF signal itself, it is possible to under-sample the incoming signal to obtain an IF signal. Obtaining an IF signal allows a reduction of the processing and analyzing time.

FIGS. 3a and 3b illustrate the effect of undersampling a waveform. FIG. 3a illustrates a waveform prior to sampling and sampling periods while FIG. 3b illustrates a waveform as reconstructed following undersampling. As shown in FIG. 3a, the waveform is sampled at a rate $Sr = 1/T$ and is a sinusoid of frequency $f_1$ where $f_1 < Sr < 2f_1$ and T is the sampling period. The reconstructed waveform is also a sinusoid with a frequency less than $f_1$. It can be shown that, given a sampling interval of T seconds, frequency components at $f_1$ and $f_1 + n/T$ Hz, n being an integer, are indistinguishable, i.e. they have the same sampling values. In the case where $Sr > 2f_1$ (greater than the Nyquist sampling rate), filtering of frequency components above $f_1$ will allow recovery of the sampled signal. However, for $Sr < 2f_1$, the frequency domain is in effect "folded" by the sampling process.

The process of undersampling may be used to effectively down-convert a signal over a limited frequency band. This process is related to the aliasing phenomenon. For example, given an effective sampling rate, Sr, of 200 MHz, an input signal having frequency components in the range of 200 MHz to 399 MHz, an output signal having frequency components from 0 to 199 MHz is created thereby achieving down conversion. Since the spectrum is "folded" it is necessary to filter out any frequency components below 200 MHz and above 400 MHz in order to avoid possible ambiguities.

This process can be employed to down convert the carrier frequency without removing or destroying the modulation as long as the modulation is below Sr/2, 100 MHz in this case. In effect, the actual "IF bandwidth" is equal to one-half of the sampling rate. In terms of the embodiment illustrated in FIG. 2, the filtering process may be undertaken by tunable filter 64 and the effective sampling rate may be controlled by processor 26 by selectively addressing the individual sampler or memory locations. The analyzer 22 in turn would adaptively read from the memory locations as specified by processor 26 to obtain the desired IF signal. The process therefore allows adaptive down-conversion of microwave signals to any desired IF. Moreover, the process may be adaptively tailored for any given response. Although the analysis may be done immediately, it may be desired to store the contents of the memories in a mass storage memory for analysis at some period after acquisition.

The above described approach offers several advantages. It can store very complex RF signals over wide bandwidths extending from DC to the GHz regime and the storage capability allows the contents to be recovered and analyzed either at RF or at IF.

Thus, the novel aspects of this invention is to use a distributed sampling technique to acquire the RF signal (by oversampling) of the IF signal (by undersampling) to convert the analog signal to digital form for digital storage and to retrieve the stored signal to perform complex signal analysis over wide RF bands. This includes the analysis of complex signals in either near real-time or at some time after acquisition. Moreover, the system may be adaptively tailored to optimize its response to any received signal, including CW signals.

The embodiments of the invention in which an exclusive property or privilege is claimed are defined as follows:

1. A microwave signal receiving apparatus comprising:
   delay line means for receiving and distributing a microwave signal;
   means for simultaneously sampling the microwave signal spatially along said delay line means and producing analog samples;
   means for converting the analog sample to digital samples;
   means for storing the digital samples;
   means for retrieving and analyzing said digital samples to determine signal characteristics of said microwave signal.

2. A microwave signal receiving apparatus as defined in claim 1, said means for sampling the signal along the delay line including a plurality of sampling gates.

3. A microwave signal receiving apparatus as defined in claim 2, further including a means for controlling the simultaneous activation of said sampling gates at predetermined timed intervals.

4. A microwave signal receiving apparatus as defined in claim 3, said means for controlling said sampling gates further comprising a pulse train generator and a processor, said processor being arranged to provide a trigger signal at predetermined timed intervals, said pulse train generator being responsive to said trigger signal to enable said gates.

5. A microwave signal receiving apparatus as defined in claim 2, said means for converting the analog samples to digital samples being a plurality of analog-to-digital converters corresponding in number to the number of said sampling gates, each of said analog-to-digital converters being associated with one of said sampling gates.

6. A microwave signal receiving apparatus as defined in claim 5, said means for storing the digital samples comprising a memory means associated with each of said analog-to-digital converters, each of said memory means having a plurality of storage locations for storing a plurality of sequential outputs of its associated analog-to-digital converters.

7. A microwave signal receiving apparatus as defined in claim 4, said means for converting the analog samples to digital samples being a plurality of analog-to-digital converters corresponding in number to the number of said sampling gates, each of said analog-to-digital converters being associated with one of said sampling gates and being responsive to an enable signal from said pulse train generator for converting the current analog sample output of its associated gate to a digital sample output.

8. A microwave signal receiving apparatus as defined in claim 7, said means for storing the digital sample includes a memory means associated with each of said analog-to-digital converters, each said memory means having a plurality of storage locations for storing a plurality of sequential outputs from its associated converter and being responsive to an enable signal from said pulse train generator for storing the current digital sample output from its associated converter in one of said storage locations.

9. A microwave signal receiving apparatus as defined in claim 8, said means for storing the digital sample being responsive to said processor for transferring digital samples in said storage locations to said means for analysing said digital signals in predetermined sequence.

10. A microwave signal receiving apparatus as defined in claim 1, further including means for filtering incoming signals connected to the input of said delay line means for filtering out signals of predetermined frequency.

11. A microwave signal receiving apparatus as defined in claim 10, further including means for selectively bypassing said filter means.

12. A microwave signal receiving apparatus as defined in claim 11, further including delay means for delaying an incoming microwave signal.

13. A microwave signal receiving apparatus as defined in claim 1, further including means for detecting the presence of RF energy at an input terminal.

14. A microwave signal receiving apparatus as defined in claim 1, further comprising means for detecting RF energy in a complex waveform;
   means for filtering the complex waveform to produce an RF-component input signal;
   means responsive to the means for detecting RF energy, for directing the complex waveform to the means for filtering; and
   means for directing the RF-component input signal to the delay line.

15. A microwave signal receiving apparatus comprising:
   an input terminal for applying an input signal to said apparatus;
   means for directing said signal along first and second paths;
   said first path including
   a processor and means for detecting the presence of RF energy at said input terminal;
   said second path including:
   means for delaying an input signal for a predetermined timed interval;
   a delay line for distributing a signal, said delay line having an input terminal;
   means for filtering out of said input signal signals of predetermined frequency, and producing a filtered input signal, said means for filtering having an output connected to said delay line input terminal;

means for switching said input signal responsive to said processor for selectively bypassing said means for filtering the input signal and applying said input signal either to said delay line input terminal or to said means for filtering said input signal, as directed by said processor;

a plurality of sampling gates spatially connected to said delay line for sampling the signal and producing a plurality of analog samples;

a plurality of analog-to-digital converters corresponding in number to the number of said sampling gates, each said analog-to-digital converters being associated with one of said sampling gates for converting the analog samples output by its associated gate to digital samples;

means for storing the digital samples, said means for storing including a memory means associated with each of said converters, each of said memory means having a plurality of storage locations for storing a plurality of sequential outputs of its associated converter;

a controller responsive to said processor for activating said gates, analog-to-digital converters and said means for storing the digital samples;

means for analyzing digital samples stored in said memory means, said means for analyzing also being capable of storing a digital representation and other predetermined parameters of said input signal, said processor being adapted to transfer digital samples from said memory means to said means for analyzing in predetermined sequence; and means for displaying signals responsive to said processor and to said means for analyzing digital samples, said means for displaying showing said input signal and/or one or more parameters of said signal.

16. A method of acquiring and analyzing a microwave signal, comprising:
  distributing the microwave signal along a delay line;
  simultaneously sampling the delay line at a plurality of discrete points therealong to produce a plurality of analog samples;
  converting each of the analog samples to a digital sample;
  storing each of the digital samples in a predetermined memory location; and
  retrieving and analyzing said digital samples to determine signal characteristics of said microwave signal.

17. A method as defined in claim 16, further including the step of accessing and analyzing each digital sample in a predetermined sequence.

18. A method as defined in claim 17, further including the step of storing all of the digital samples in a mass storage device.

19. A method as defined in claim 17, further including the step of repeating said sampling, converting and storing steps before commencing said accessing and analyzing steps.

20. A method as defined in claim 16, wherein said sampling step is effected at a rate which results in oversampling of said signal.

21. A method as defined in claim 16, wherein said sampling step is effected at a rate which results in undersampling sampling of said signal.

22. A method as defined in claim 21, wherein the sampling rate, Sr, is $f_1 < Sr < 2f_1$, where $f_1$ is the frequency of the signal.

23. A method of acquiring a signal to be analyzed, comprising:
  (a) selecting a frequency range within which signals are to be acquired;
  (b) distributing signals within said range along a delay line;
  (c) simultaneously sampling the delay line at a plurality of discrete points therealong to produce a group of analog samples;
  (d) simultaneously converting each of the analog samples to a digital sample;
  (d) simultaneously storing each of the digital samples of the group of samples in predetermined memory locations;
  (e) repeating steps (c), (d) and (e).

24. A method of a method of down-converting an RF signal having frequency components between $f_1$ and $f_2$, where $f_2$ is greater than $f_1$, to an IF signal, comprising:
  (a) filtering said RF signal to remove frequency components below $f_1$ and above $f_2$;
  (b) distributing the RF signal along a delay line;
  (c) simultaneously sampling the delay line at a sampling rate Sr which is greater than $f_1$ and less than $f_2$ and at a plurality of discrete points along said delay line to produce a group of analog sample;
  (d) simultaneously converting each of the analog samples to a digital samples;
  (e) simultaneously storing each of the digital samples in predetermined memory locations;
  (f) repeating steps (c), (d) and (e) until all of the RF signal has been sampled;
  (g) constructing a new signal by sequentially accessing the digital samples in said memory locations.

25. A method of a method of down-converting an RF signal having frequency components between $f_1$ and $f_2$ is greater than $f_1$, to an IF signal, comprising:
  (a) filtering said RF signal to remove frequency components below $f_1$ and above $f_2$;
  (b) distributing the RF signal along a delay line;
  (c) simultaneously sampling the delay line at a sampling rate Sr which is greater than the Nyquist sampling rate and at a plurality of discrete points along said delay line to produce a group of analog samples;
  (d) simultaneously converting each of the analog samples to a digital sample;
  (e) simultaneously storing each of the digital samples in predetermined memory locations;
  (f) repeating steps (c), (d) and (e) until all of the RF signal has been sampled;
  (g) constructing a new signal by sequentially accessing only predetermined ones of the digital samples in said memory locations.

* * * * *